(12) United States Patent
Cohen et al.

(10) Patent No.: US 6,233,659 B1
(45) Date of Patent: May 15, 2001

(54) MULTI-PORT MEMORY DEVICE WITH MULTIPLE MODES OF OPERATION AND IMPROVED EXPANSION CHARACTERISTICS

(75) Inventors: Robert Cohen; Jeff Ladwig, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/035,549

(22) Filed: Mar. 5, 1998

(51) Int. Cl.⁷ .................................................. G06F 12/02
(52) U.S. Cl. ............................................. 711/153; 711/149
(58) Field of Search ..................................... 711/147, 149, 711/150, 152, 153

(56) References Cited

U.S. PATENT DOCUMENTS

| | | | |
|---|---|---|---|
| 4,325,116 | * 4/1982 | Kranz et al. ........................... | 711/151 |
| 4,511,960 | * 4/1985 | Boudreau ............................... | 711/219 |
| 4,698,753 | * 10/1987 | Hubbins et al. ....................... | 709/209 |
| 5,043,937 | * 8/1991 | Glaise et al. .......................... | 711/147 |
| 5,459,842 | * 10/1995 | Begun et al. .......................... | 711/155 |
| 5,568,615 | * 10/1996 | Sederlund et al. ............... | 395/200.08 |
| 5,659,711 | * 8/1997 | Sugita .................................... | 711/144 |

* cited by examiner

Primary Examiner—Kevin L. Ellis
(74) Attorney, Agent, or Firm—Thorp Reed & Armstrong (57) ABSTRACT

The present invention is directed to a multi-port memory device responsive to two systems. The device includes an array of memory cells each represented by a unique row and column address. The memory device has first and second input/output ports and an input/output control circuit, responsive to the first and second input/output ports, for writing data into and reading data of the array. The device further includes a first signal decoder responsive to the first system for producing first signals for accessing a cell within said array. The device also includes a second signal decoder responsive to the second system for producing second signals for accessing a cell within the array. A control circuit is responsive to the first and second systems for identifying which of the systems is entitled to access to the array in the event both systems seek access to the same address at the same time. The address and data associated with the address from the system not having access are saved so that the operation can be performed when access is granted.

9 Claims, 7 Drawing Sheets

MULTI-PORT MEMORY DEVICE WITH MULTIPLE MODES OF OPERATION AND IMPROVED EXPANSION CHARACTERISTICS

BACKGROUND OF THE INVENTION

1. Field of the Invention

The present invention is directed generally to multi-port random access memories (RAMs) and, more particularly, to a multi-port RAM having multiple operating modes.

2. Description of the Background

RAMs having two or more ports are known as multi-port RAMs. Multi-port RAMs allow two or more devices to share and manipulate a common set of data at the same time. There are several variations of multi-port RAMs such as video RAMs (VRAMs), two and three port RAMs, and RAMs having a combination of random access and sequential access ports, all of which are described in U.S. Pat. No. 4,891,794, issued to Hush et al. and assigned to Micron Technology, Inc., and U.S. Pat. No. 5,450,355, issued to Hush and assigned to Micron Technology, Inc., both of which are hereby incorporated by reference. Multi-port RAMs come in many variations and have many applications.

Multi-port RAMs have the disadvantage that data collisions occur when two or more ports attempt to access the same memory address at the same time. Data collisions often result in corrupt data at the data address where the collision occurs, and as a result, the integrity of the data must be restored, resulting in lost process cycles. To prevent data collisions, access to a multi-port RAM needs to be monitored and controlled. If two or more ports attempt to access the same data address, one port will be given immediate access, and the other port will be given an interrupt signal and forced to wait. Multi-port RAMs can typically determine when a data collision has already occurred, but require the help of external devices to prevent a data collision.

An approach to preventing data collisions in a dual port RAM is described in U.S. Pat. No. 5,454,095, issued to Kraemer et al. A dual port RAM is divided into two regions with one port having read only access to one region and write only access to the other region, while the other port has the opposite privileges. That alone, however, does not prevent data collisions, so the ports are further restricted such that both must perform the same function, either a read or a write, at the same time. Although those devices successfully eliminate data collisions without the need for external devices, they limit the usefulness of the dual port RAMs.

Expanding a memory array using multi-port RAMs is often a complex procedure. Most multi-port RAMs come in two variations, a master and a slave. In a memory array there must be only one master, and the remainder slaves. The master monitors the addresses being accessed by each port, and with the help of external devices, may provide an interrupt signal to prevent data collisions. In that way, if a potential data collision is sensed, the master decides which port may access the memory address immediately and which port or ports must wait. If more than one master is used, there may be conflicting decisions between the masters so that one master inhibits one port, while another master inhibits the other port, resulting in neither port gaining access to the RAM. Thus, the need exists to provide a multi-port RAM which has the capability to avoid collisions without the need for external devices. The need also exists for a multi-port RAM architecture which avoids the master/slave functions such that expansion can be easily accomplished.

SUMMARY OF THE INVENTION

The present invention is directed to a multi-port memory device responsive to two systems. The device includes an array of memory cells each represented by a unique row and column address. The memory device has first and second input/output ports and an input/output control circuit, responsive to the first and second input/output ports, for writing data into and reading data of the array. The device further includes a first signal decoder responsive to the first system for producing first signals for accessing a cell within said array. The device also includes a second signal decoder responsive to the second system for producing second signals for accessing a cell within the array. A control circuit is responsive to the first and second systems for identifying which of the systems is entitled to access to the array in the event both systems seek access to the same address at the same time.

The address and data associated with the address from the system not having access are saved so that the operation can be performed when access is granted.

The present invention allows multiple processors to share a common memory while eliminating support devices typically found in the prior art. The memory device of the present invention allows the processors associated with the first and second systems to run at the same or different speeds and to access the common memory at the same or different times.

According to one embodiment of the present invention, the memory device can be allocated to allow either the entire memory to be accessible by both processors or divided so that each processor has write and read privileges with respect to some portion of the memory. The ability to control access privileges is determined by two mode signals which provide four different modes of operation. Because the control circuit of the present invention controls the storage of information associated with the row and column signals of the system not granted access, no interrupt signals are generated to interrupt the operation of the processors. Also, the design of the present invention is completely expandable in both address size and data word size without requiring the selection of a master and slave components. Those advantages and benefits of the present invention, and others, will become apparent from the description of the preferred embodiments appearing hereinbelow.

BRIEF DESCRIPTION OF THE DRAWINGS

For the present invention to be clearly understood and readily practiced, the present invention will be described in conjunction with the following figures, wherein.

DESCRIPTION OF THE PREFERRED EMBODIMENTS

Figure 1:
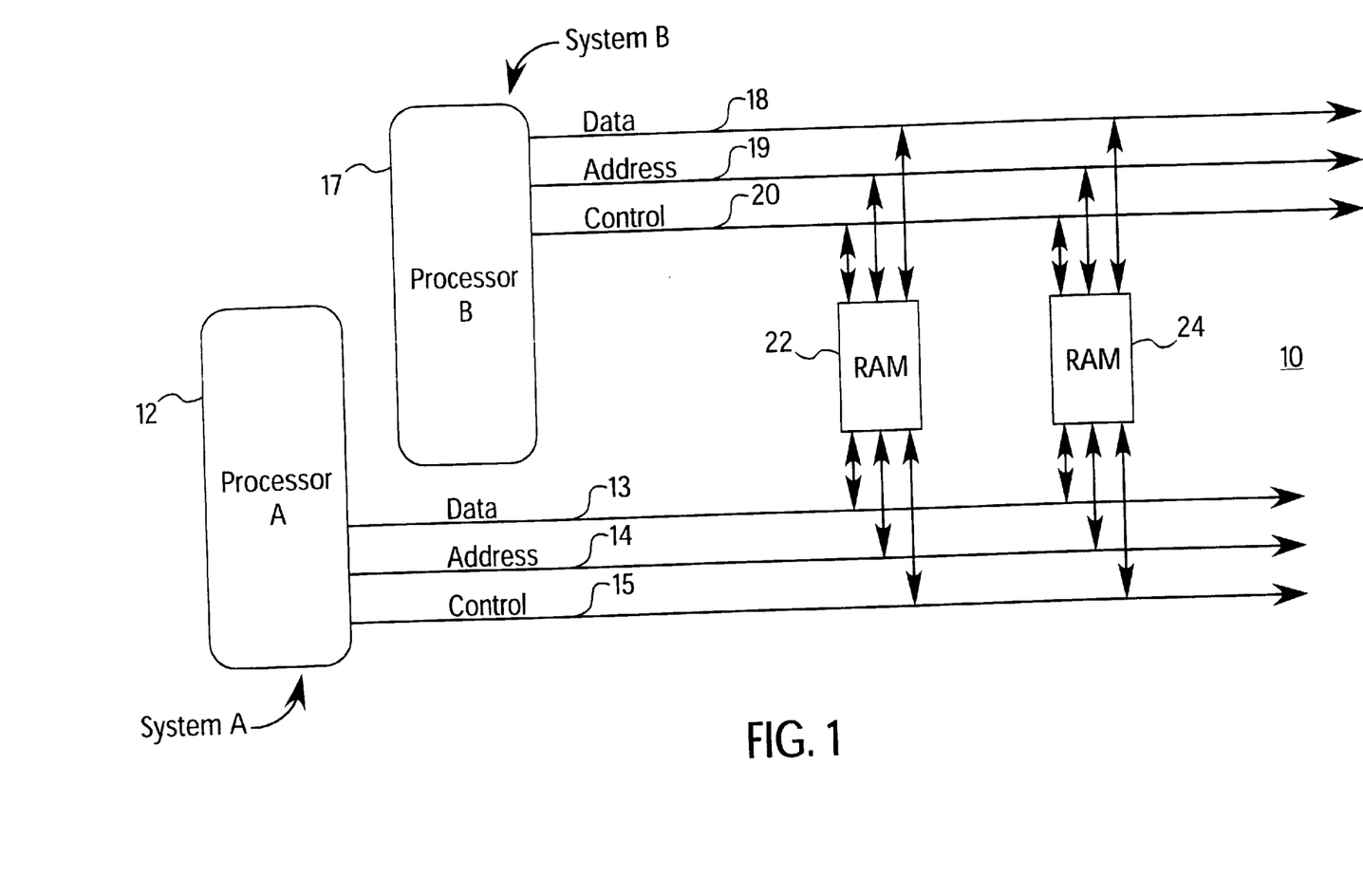
FIG. 1 is a high level block diagram illustrating a microprocessor-based system in which the multi-port memory of the present invention may be employed.

FIG. 1 is a high level block diagram illustrating a processor-based system 10 in which multi-port memory devices of the present invention may be employed. The system 10 is comprised of a first processor 12 having a data bus 13, an address bus 14, and a bus 15 for carrying control signals. The first processor 12 and associated buses are sometimes referred to herein as system A. The system 10 is also comprised of a second processor 17 having a data bus 18, an address bus 19, and a control bus 20. The second processor 17 and associated buses are sometimes referred to herein as System B. Each of the processors 12 and 17 communicates with a plurality of multi-port memory devices of which two, first multi-port memory device 22 and second multi-port memory device 24, are illustrated. The multi-port memory devices 22 and 24 may be constructed of, for example, random access memory. Although the buses 13, 14, and 15 and 18, 19, and 20 are depicted as separate buses, it can be understood by those skilled in the art that data, addresses, and control signals may be carried on one or two buses instead of three.

Figure 2:
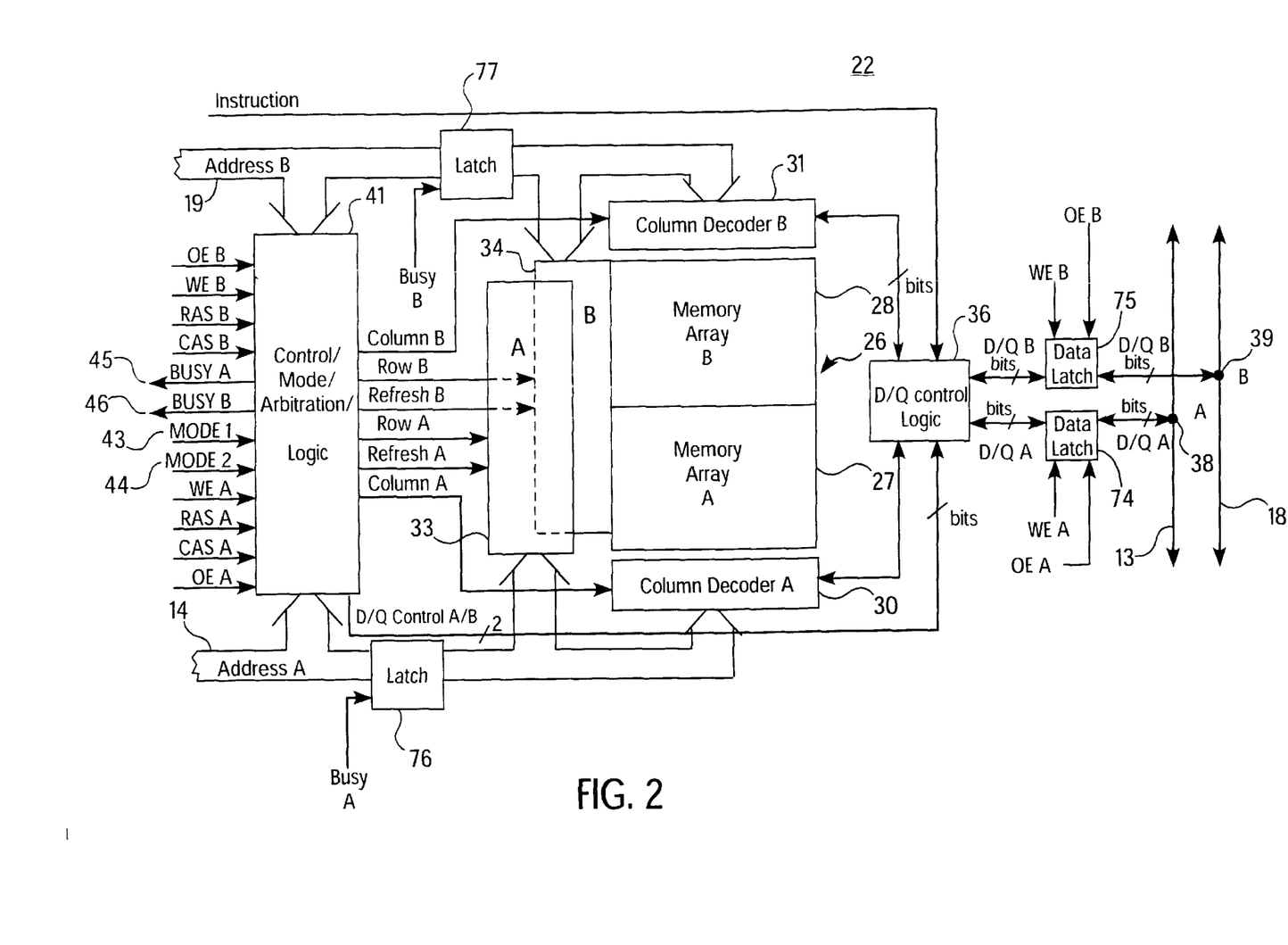
FIG. 2 is a block diagram illustrating a multi-port memory constructed according to the teachings of the present invention.

FIG. 2 is a block diagram illustrating a multi-port memory device 22 constructed according to the teachings of the present invention. The memory device 22 is comprised of an array of memory cells 26, each cell being represented by a unique row and column address as is known in the art. Each memory cell may be, for example, a random access type of cell. The memory array 26 may be divided into an A section 27 and a B section 28.

The memory array 26 is provided with an A column decoder 30 for section A, a B column decoder 31 for section B, an A row decoder 33 for section A, and a B row decoder 34 for section B. An input/output control logic circuit 36 is responsive to the first data bus 13 through a first input/output port 38 and is responsive to the second data bus 18 through a second input/output port 39. The input/output control logic circuit 36 is also responsive to an instruction bit for complex read or write operations. The instruction bit, if active, indicates that the information supplied on the data bus 13 or the data bus 18 is an instruction that performs a function, such as a page write or read. The input/output control logic circuit 36 contains write drivers and sense amplifiers as is known in the art for writing information to the memory array 26 from the data buses 13 and 18, and for outputting information from the memory array 26 onto data buses 13 and 18, respectively. The construction and operation of such write drivers and sense amplifiers does not form a feature of the preset invention. Accordingly, such devices are not further described herein.

The memory device 22 includes a circuit 41 which performs three functions: generation of control signals, mode selection, and arbitration. The control circuit portion of the circuit 41 receives the following signals as input: OE B, WE B, RAS B, CAS B, OE A, WE A, RAS A, and CAS A. In response to those inputs, the circuit 41 produces the following outputs: Column B, Row B, Refresh B, Row A, Column A, Refresh A, and D/Q control. Those input signals and output signals are well known in the art, do not form a feature of the present invention, and are not further described herein. The mode selection function performed by circuit 41 is described in greater detail hereinbelow in connection with FIG. 3 while the arbitration function performed by circuit 41 is described in greater detail hereinbelow in conjunction with FIG. 4.

Completing the description of the device 22 shown in FIG. 2, address information from address bus 14 associated with first processor 12 is input to circuit 41, a latch 76, A row decoder 33, and A column decoder 30. Address information from address bus 19 associated with the second processor 17 is input to the circuit 41, a latch 77, B row decoder 34, and B column decoder 31. The other signals input to circuit 41 are a Mode 1 signal 43 and a Mode 2 signal 44 which are discussed in detail in conjunction with FIG. 3. Signals output from circuit 41 are a Busy A signal 45 and a Busy B signal 46 which are discussed in detail in conjunction with FIG. 4.

Figure 3:
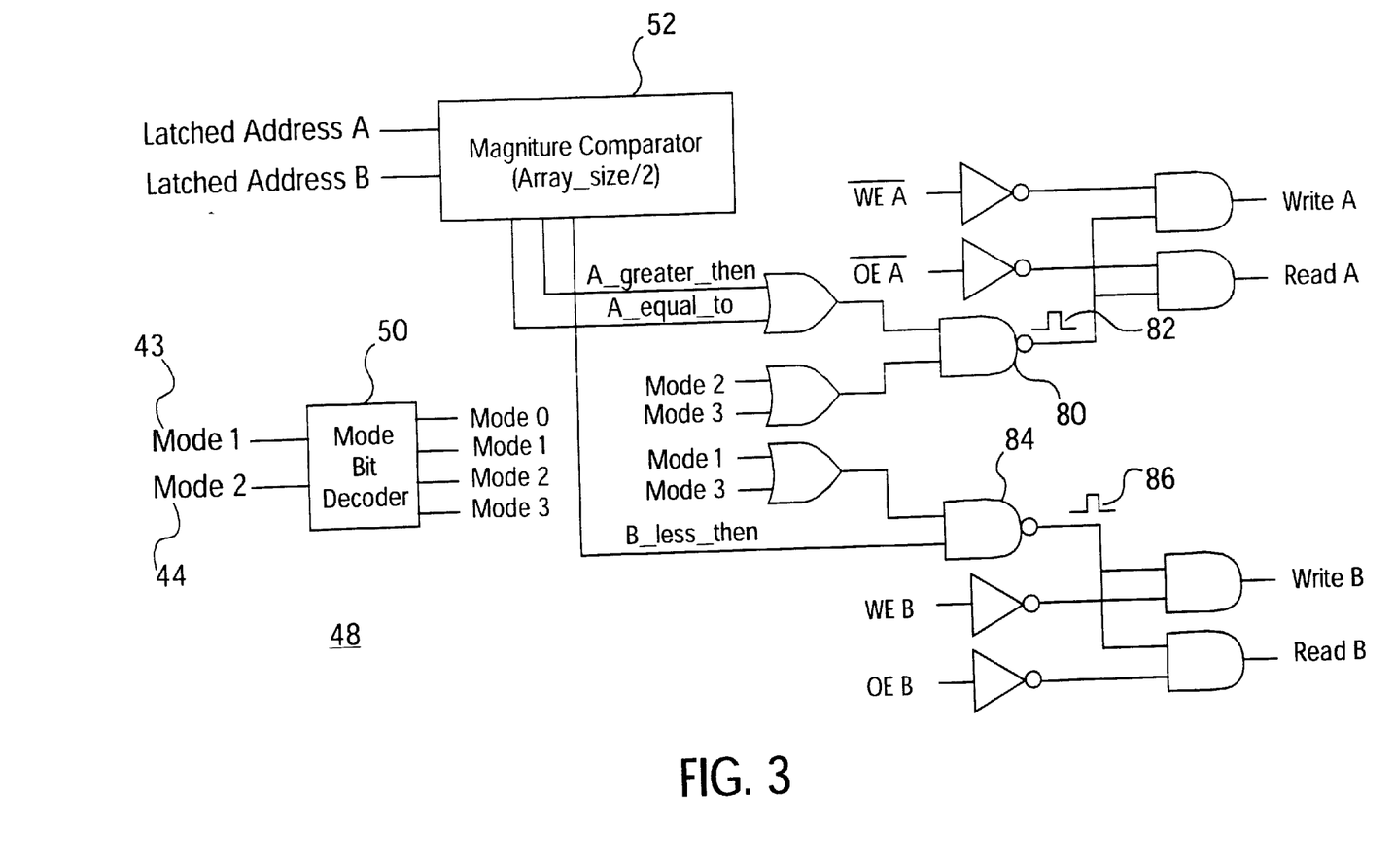
FIG. 3 is a block diagram illustrating the details of the mode selection circuit illustrated in FIG. 2.

Turning now to FIG. 3, a mode control circuit 48 is illustrated. According to one embodiment of the present invention, mode signals 43 and 44 are externally generated, for example, by first processor 12 or second processor 17. The mode signals 43 and 44 are used by a mode bit decoder 50 to select one of the following four modes of operation:

mode 0—port 38 and port 39 have read/write privilege to the entire shared memory array 26;

mode 1—port 38 has read/write privilege to the entire shared memory array 26 while port 39 has read/write privilege to section B of shared array 26;

mode 2—port 38 has read/write privilege to section A of shared array 26 while port 39 has read/write privilege to the entire shared memory array 26; and mode 3—port 38 has read/write privilege to section A of shared memory 26 while port 39 has read/write privilege to section B of shared memory 26. Those of ordinary skill in the art will recognize that other array sections and modes of operation can be defined.

The mode bit decoder 50 receives mode signals 43 and 44 and decodes those signals to provide four mode bits: mode 0, mode 1, mode 2, and mode 3. It is anticipated that one of the mode bits 0–3 will be high (low) while the other three mode bits are low (high) thereby indicating the mode selected by mode signals 43 and 44 for operation of the multi-port memory device 22.

After the address has been latched by the RAS and CAS signals as is known, the address is compared in a comparator 52 to (Array size)/2 to determine in which half of the memory 26 the address is located. Specifically, the address at the A column decoder 30, the B column decoder 31, the A row decoder 33 and the B row decoder 34 is compared to determine if it is less than or equal to (Array size)/2 and the address at the A column decoder 30, the B column decoder 31, the A row decoder 33 and the B row decoder 34 is compared to determine if it is greater than (Array size)/2. The output of the comparator 52 is then gated with the mode bits which are appropriate for the port (mode bits 2,3 for address port A of the A column decoder 30 and the A row decoder 33 and mode bits 1,3 for address port B of the B column decoder 31 and the B row decoder 34). The result of that combination enables a NAND gate 80 to produce an enable signal 82. The enable signal 82 is then gated with a write enable signal $\overline{WE}$ A and a read enable signal $\overline{OE}$ A to create WRITE A and READ A signals, respectively.

In a similar manner, a NAND gate 84 produces an enable signal 86. The enable signal 86 is then gated with a write enable signal $\overline{WE}$ B and a read enable signal $\overline{OE}$ B to create WRITE B and READ B signals, respectively. Those four signals (WRITE A, READ A, WRITE B, READ B) are used as the gating signals for writing data to and reading data from the shared memory 26 in a known manner. Because generation of those four signals is controlled by the mode control circuit 48, mode control circuit 48 controls the section of the memory device 26 to which ports 38 and 39 have access.

Data is latched into latches 74 and 75 by the WE A and WE B signals, respectively, to perform a delayed write function. The OE A and OE B signals are input to latches 74 and 75, respectively, and are for a delayed read operation.

Figure 4:
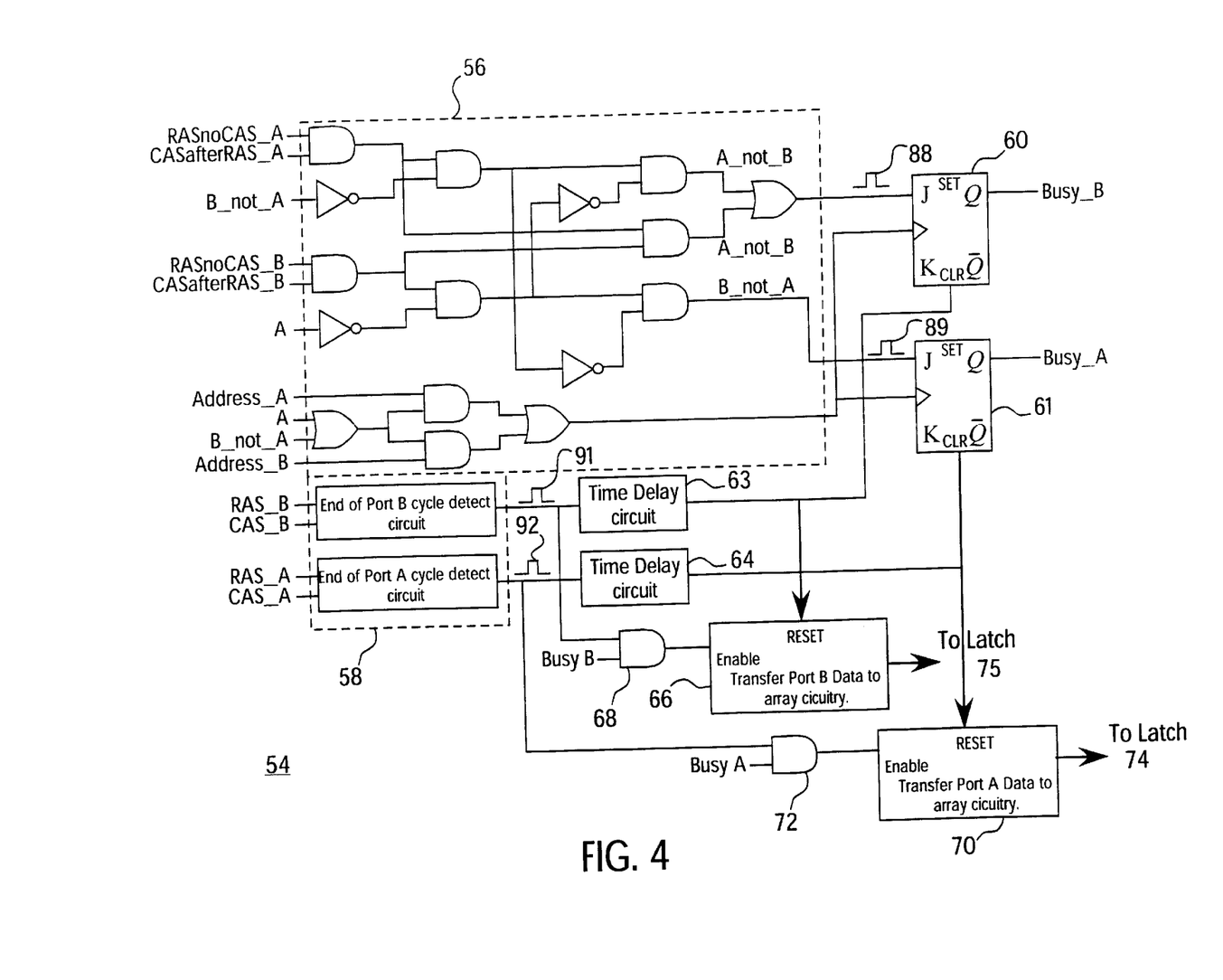
FIG. 4 is a block diagram illustrating the details of the arbitration circuit illustrated in FIG. 2.

Delaying the read/write operations is a function of the Busy signals as discussed in conjunction with FIG. 4.

In FIG. 4, an arbitration circuit 54, which is part of the circuit 41 illustrated in FIG. 2, is shown. In summary, the arbitration circuit 54 operates as follows. Assume processor A and processor B are trying to write to the same memory address. Processor A will get control of the internal address and data bus, which is a built-in default condition. Other fault conditions can be provided. As a result of processor A and processor B addressing the same memory location, a Busy B signal will be produced indicating that processor A has control of the location. The Busy B signal is input to processor B indicating that the device is busy. The Busy B signal will also cause the address from processor B to be latched into the latch 77. The address and data that processor B presented to the memory device 22 will be processed automatically after processor A completes its task. If processor B was attempting a write operation, processor B can continue with other tasks. The address and data which were stored in latches 75 and 77, enable the write operation to be conducted as soon as processor A is finished with its task. If processor B was attempting a read operation, processor B will have to wait for the data until processor A completes its task. Then the address and read operation, which was stored in latches 75 and 77, is acted upon to retrieve the requested data from the array 26. The details of the hardware to implement that functionality will now be described.

In FIG. 4, the arbitration circuit 54 has a first logic circuit 56 which produces signals 88 and 89 indicative of whether a valid access to an address by system A or system B, respectively, has been made. Arbitration circuit 54 also includes a second logic circuit 58 which provides a signal 91 indicating when the end of a port 39 cycle is detected and a signal 92 when an end of a port 38 cycle is detected. The signal 88 is input to a J terminal of a flip-flop 60. The signal 91 is input to a clear terminal of the flip-flop 60 through a time delay circuit 63. The signal 89 is input to a J terminal of a flip-flop 61. The signal 92 is input to the clear terminal of the flip-flop 61 through a time delay circuit 64. The flip-flop 60 produces the Busy B signal upon receipt of signal 88 at the J terminal and the clock signal. Recall that the signal 88 is indicative of system A having validly accessed a memory cell. Accordingly, the Busy B signal indicates that the B system must wait until the A system has completed its task.

When the end of a port 39 cycle has been detected, the signal 91 is produced but is delayed by circuit 63 before being input to the clear terminal of flip-flop 60 and the reset terminal of a flip-flop 66. When the end of the cycle at port 39 has been detected, it is now necessary to store data for a later write operation, read commands, or some other information defining a task which system B had intended to perform had the memory location not been busy. Because system B is no longer trying to access the memory location, flip-flop 60 may be cleared. At the same time, flip-flop 66, which has been enabled by an AND gate 68 receiving the signal 91 and the Busy B signal, is reset, thereby producing a pulse. That pulse is used to transfer the information at port 39 to latch 75 where it is latched.

A similar function is provided with respect to the A system. Should the B system validly access a memory cell which the A system wants to access, a Busy A signal is provided by flip-flop 61. A flip-flop 70 and an AND gate 72 provide similar functions as flip-flop 66 and AND gate 68, respectively. A pulse is generated which is used to transfer the information at port 38 to latch 74 where it is latched.

While the information, e.g. address, data to be written, read instructions, etc. is being stored, System A continues its task. Upon completion of its task, a signal is generated by the second logic circuit 58 which is input to the latch 75 containing the information. The address information is input to the appropriate row and column decoder from the latch 77. After the address has been accessed, the instruction or data is output from the latch 75 and the appropriate read/write task is performed.

Figure 5:
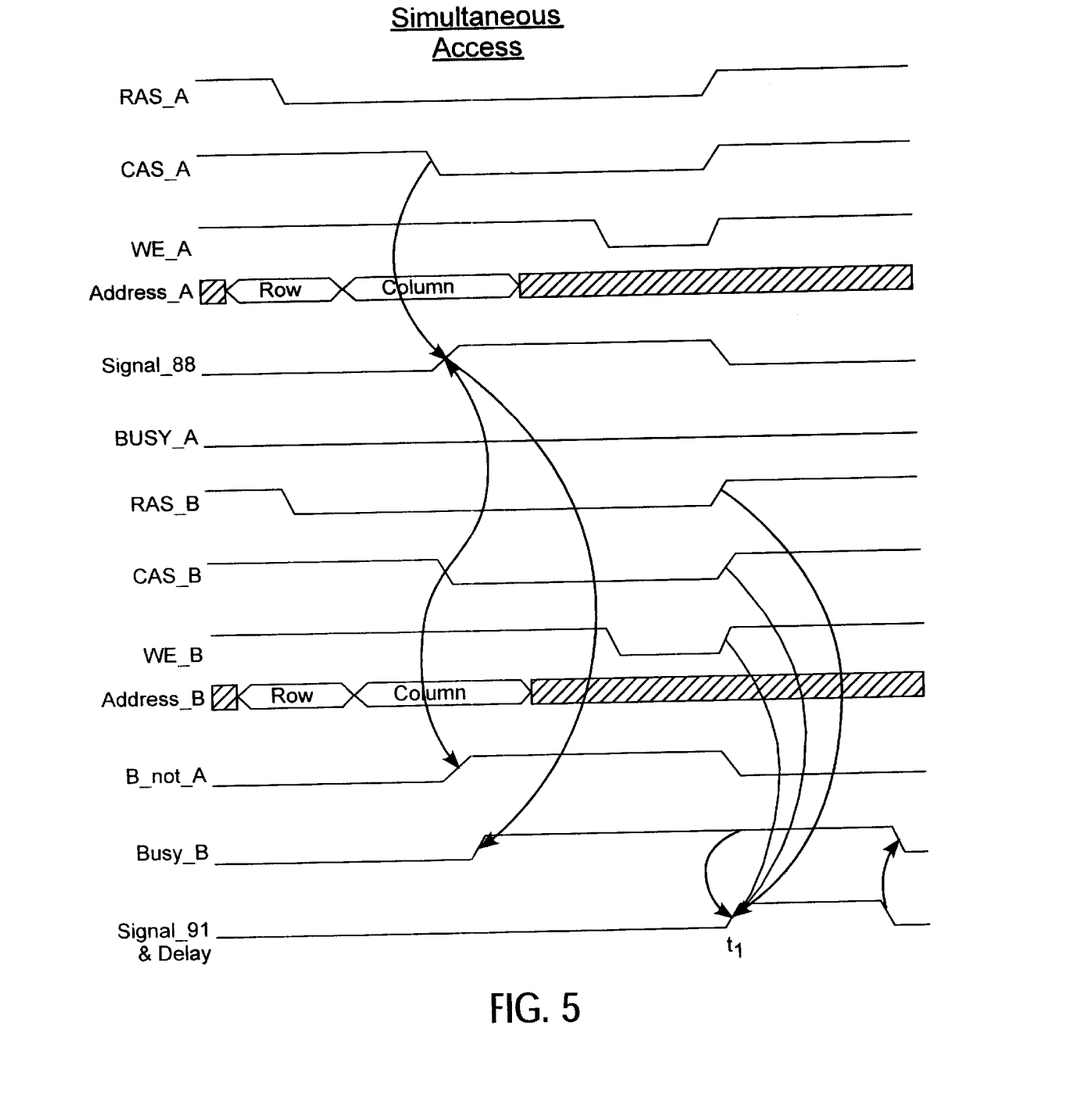
FIGS. 5 and 6 illustrate timing diagrams for various signals found in the multi-port memory of FIG. 2 for sequential and simultaneous access, respectively.
Figure 6:
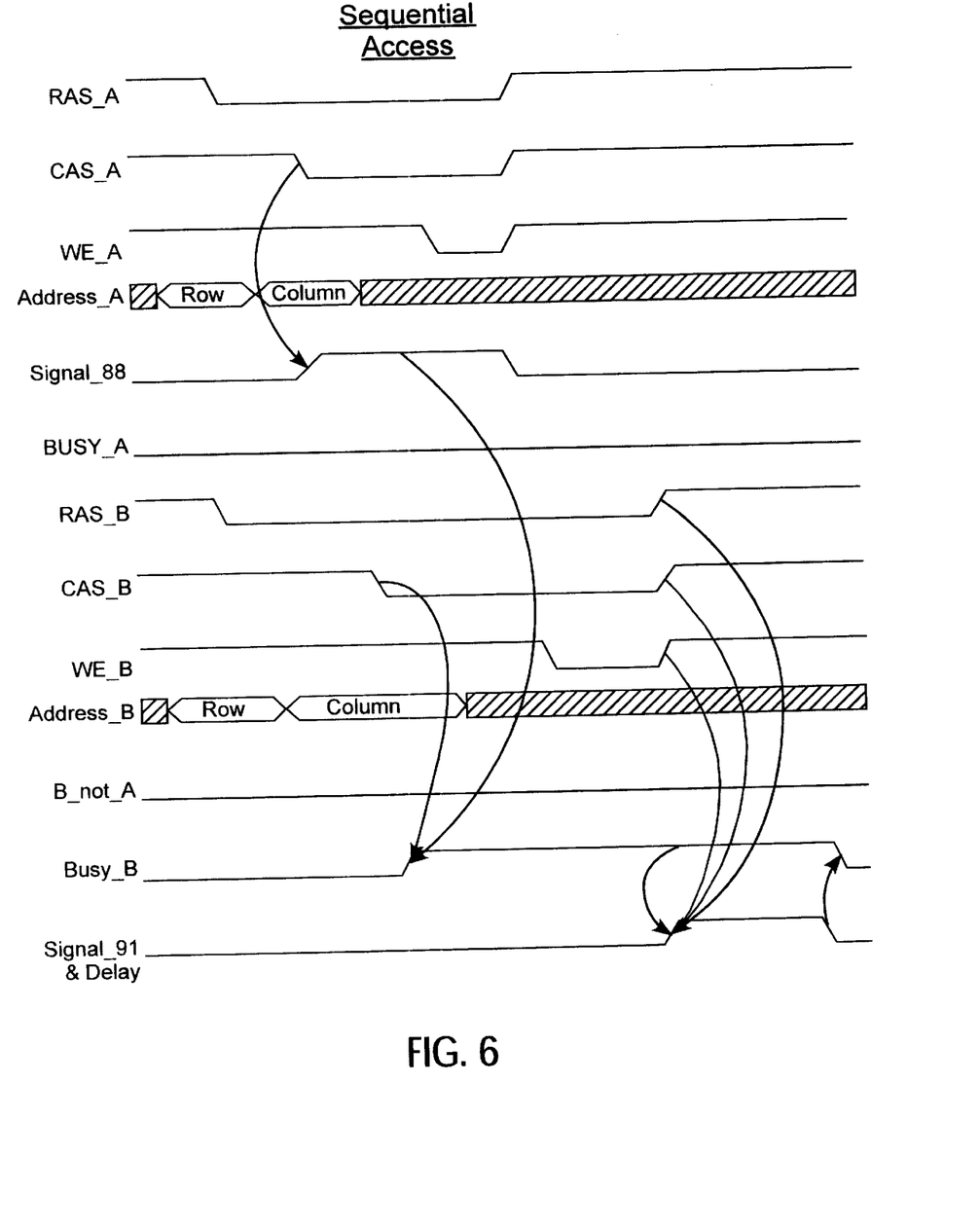

Two timing diagrams are illustrated in FIGS. 5 and 6 which illustrate the operation of the arbitration circuit 54. In FIG. 5, when the signal 88 goes high, indicating that system A has validly accessed a memory cell, the Busy B signal also goes high. When RAS B and CAS B both go high, indicating an end of a port 39 cycle, the signal 91 goes high at the end of the time delay. Upon the return of signal 91 to a low state, the Busy B signal goes low.

At the time that the Busy B signal goes high, signal 91 is still low such that the output of AND gate 68 remains low thereby preventing flip-flop 66 from being enabled. When the Busy B signal is high, and signal 91 goes high, as shown at time $t_1$, in FIG. 5, the flip-flop 66 is enabled, and stays enabled producing an output signal until the pulse of signal 91 propagates through time delay circuit 63. After signal 91 returns to a low state, flip-flop 66 is reset causing the Busy B signal to return to zero.

FIG. 6 is a timing diagram similar to FIG. 5 but illustrates sequential rather than simultaneous access.

Figure 7:
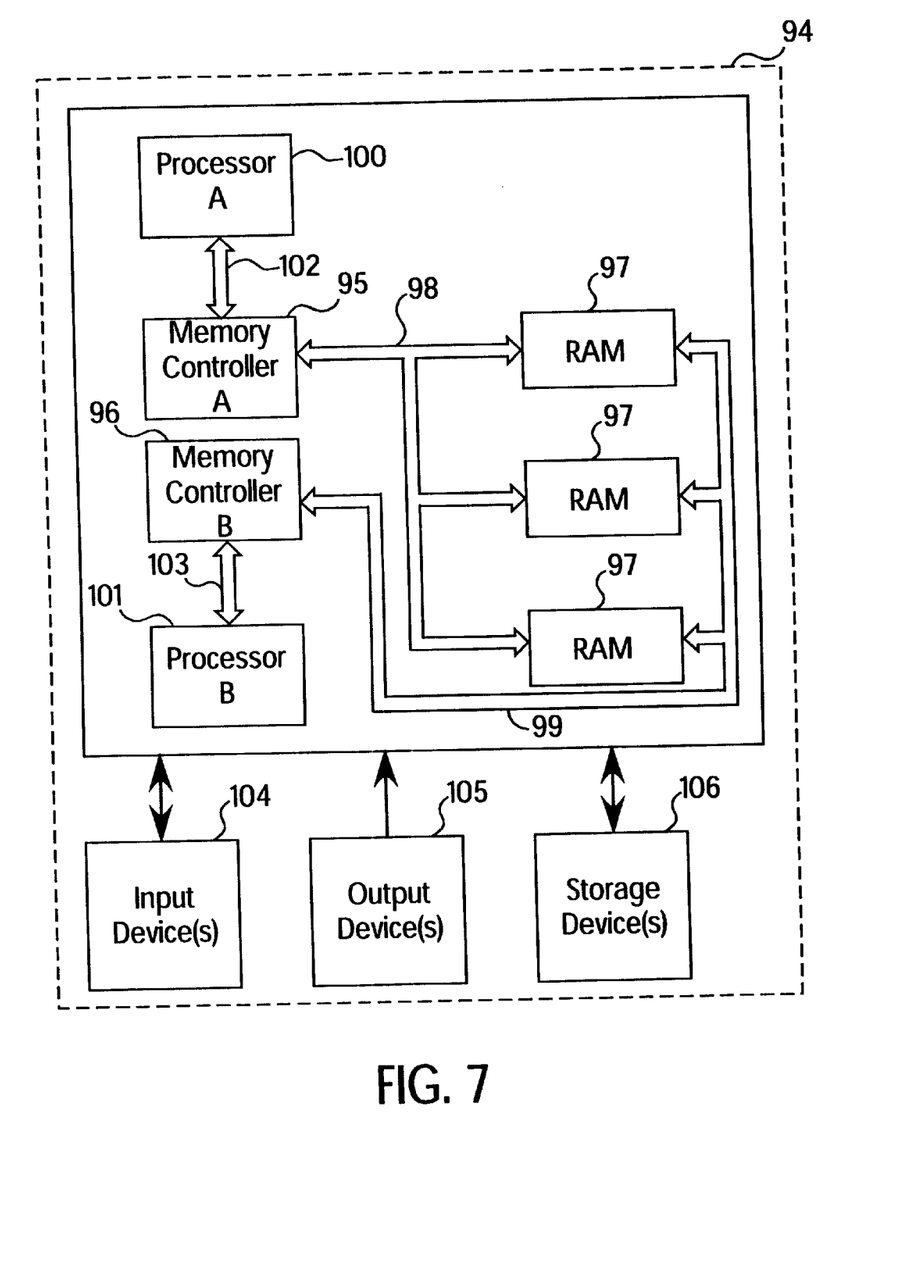
FIG. 7 illustrates a computer system in which the present invention may be incorporated.

FIG. 7 illustrates a computer system 94. The computer system 94 utilizes memory controllers 95 and 96 in communication with memories 97 through buses 98 and 99, respectively. The memory controllers 95 and 96 are also in communication with processors 100 and 101 through buses 102 and 103, respectively. The processors 100 and 101 can perform a multitude of functions based on information and data stored in the memories 97. One or more input devices 104, such as a keyboard or a mouse, are connected to at least one of processor 100 and processor 101 to allow the input of data, instructions, etc. One or more output devices 105 are provided to display or otherwise output data data generated by the processors 100 and 101. Examples of output devices include printers and video display units. One or more data storage devices 106 may be coupled to the processors 100 and 101 to store data on, or retrieve information from, external storage media. Examples of storage devices 106 and storage media include drives that accept hard and floppy disks, tape cassettes, and CD read-only memories.

The present invention allows multiple processors to share a common memory while eliminating support devices typically found in the prior art. Access to the common memory is provided without the need for master/slave relationships. Because of that, the architecture of the present invention allows for the memory device to be completely expanded in both address size and data word size without the need to determine master/slave relationships and how they are affected by the change in size.

The memory device of the present invention allows the processors associated with the first and second systems to run at the same or different speeds and to access the common memory at the same or different times. The mode control circuit allows the memory device to be allocated in a variety of ways. Depending on the number of mode control signals, any number of variations can be achieved in which the systems are given different types of access to the memory.

Finally, because the arbitration circuit of the present invention stores information associated with the task that was to be performed by the system not granted access, that task can be performed as soon as the task by the system granted access is completed. In that manner, the processor for the system not granted access need not be interrupted and there are no wait states. In the case of a read operation, the processor is provided with a message, in the form of a Busy signal, indicating that it must wait for the information it requested. In the case of a write operation, the write operation will be performed as soon as the memory location is free such that the processor need not be concerned about repeating instructions.

Those of ordinary skill in the art will recognize that many modifications and variations of the present invention may be implemented. The foregoing description and the following claims are intended to cover all such modifications and variations.

What is claimed is:

1. A system comprising:
   a first processor;
   a second processor;
   a first memory controller;
   a second memory controller;
   a plurality of multi-port memory devices each memory device comprising:
      an array of memory cells each represented by a unique address;
      first and second input/output ports;
      an input/output control circuit responsive to said first and second input/output ports, said control circuit for writing data into and reading data out of said array;
      a first storage device positioned between said first and second input/output ports and said input/output control circuit;
      a first signal decoder circuit responsive to said first system for producing signals for accessing a cell within said array;
      a second signal decoder circuit responsive to said second system for producing signals for accessing a cell within said array;
      a second storage device for storing addresses; and
      a control circuit responsive to said first and second systems for identifying which of the systems is entitled to access to said array and for controlling the operation of said input/output control circuit and said first and second storage devices;
   a first bus connecting said first processor and said first memory controller;
   a second bus connecting said first memory controller and said memory devices;
   a third bus connecting said second processor and said second memory controller; and
   a fourth bus connecting said second memory controller and said memory devices.

2. The system of claim 1 wherein said control circuit includes an arbitration circuit for identifying which of the first and the second processors may have access to the array, and for producing signals for controlling the operation of said first and second storage devices so as to store information from the processor denied access to the array.

3. The system of claim 2 wherein the information is stored for a period of time sufficient to enable the processor having access to complete its task.

4. The system of claim 1 wherein said control circuit includes an arbitration circuit having a first circuit for determining a valid access to an address in said array by one of the processors, a second circuit for detecting when an access is completed, and a third circuit responsive to said first circuit and said second circuit for generating a busy signal.

5. The system of claim 4 wherein said third circuit generates said busy signal when a valid access to an address is determined and ceases generation of said busy signal when an end of cycle is detected for the processor having access to said address.

6. The system of claim 5 wherein said third circuit includes a flip-flop.

7. The system of claim 1 wherein said control circuit includes a mode circuit responsive to mode control signals, said mode circuit for determining the degree of access to said array to which each of the two processors is entitled.

8. The system of claim 7 wherein said array of memory cells is divided into two sections, and wherein said mode control signals determine if both processors have read/write privileges to both said sections, if one processor has read/write privileges to both said sections while said other processor has read/write privileges to only one section of said array, and if one processor has read/write privileges to one section of said array while the other processor has read/write privileges to the other section of said array.

9. A The system of claim 8 wherein said mode circuit includes a comparator circuit for determining the section specified in an address, a decoder circuit for decoding said mode control signals, and a logic circuit responsive to said comparator circuit and said decoder circuit for producing read and write control signals.

* * * * *